United States Patent [19]

Spinner, III et al.

[11] Patent Number: 5,268,325
[45] Date of Patent: Dec. 7, 1993

[54] METHOD FOR FABRICATING A POLYCRYSTALLINE SILICON RESISTIVE LOAD ELEMENT IN AN INTEGRATED CIRCUIT

[75] Inventors: Charles R. Spinner, III, Dallas; Fu-Tai Liou, Carrollton, both of Tex.

[73] Assignee: SGS-Thomson Microelectronics, Inc., Carrollton, Tex.

[21] Appl. No.: 741,793

[22] Filed: Aug. 6, 1991

Related U.S. Application Data

[62] Division of Ser. No. 531,022, May 31, 1990, Pat. No. 5,068,201.

[51] Int. Cl.⁵ .......................................... H01L 21/70
[52] U.S. Cl. ................................. 437/60; 437/52; 437/918; 148/DIG. 136
[58] Field of Search .................. 437/60, 918, 52, 59; 148/DIG. 136, DIG. 117

[56] References Cited

U.S. PATENT DOCUMENTS

| | | | |
|---|---|---|---|
| 4,592,128 | 6/1986 | Bourassa | 437/60 |
| 4,604,789 | 8/1986 | Bourassa | 437/918 |
| 4,948,747 | 8/1990 | Pfiester | 437/60 |
| 4,965,214 | 10/1990 | Choi et al. | 437/918 |
| 5,126,279 | 6/1992 | Roberts | 437/60 |

Primary Examiner—Tom Thomas
Assistant Examiner—Tuan Nguyen
Attorney, Agent, or Firm—Kenneth C. Hill; Lisa K. Jorgenson; Richard K. Robinson

[57] ABSTRACT

A method for forming integrated circuit structures includes the formation of high-value resistive elements and low resistance interconnect in a single polycrystalline layer. In one embodiment, interconnect regions of the polycrystalline silicon layer are masked, and resistive element regions are partially oxidized to reduce the thickness of the polycrystalline layer in such regions. Resistivity of the interconnect regions may then be reduced by implanting a high level of impurities in them, or by forming a refractory metal silicide layer over the interconnect regions. The oxide formed over the resistive elements during the oxidation thereof protects them from either of the following process steps, so that no masking is required. In an alternative embodiment, silicidation of the interconnect regions of the polycrystalline silicon layer may be performed without the prior local oxidations of the resistive element regions.

4 Claims, 5 Drawing Sheets

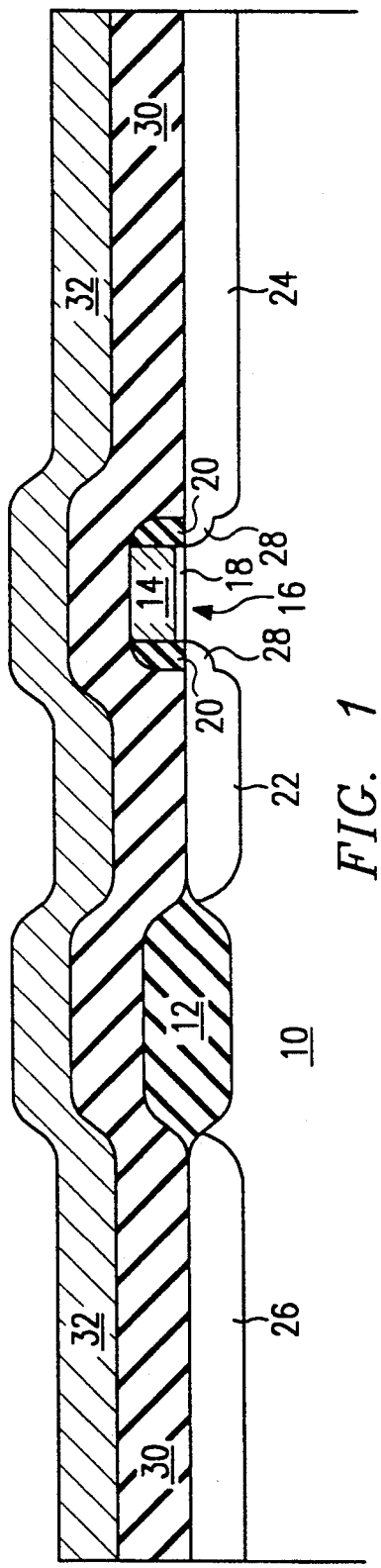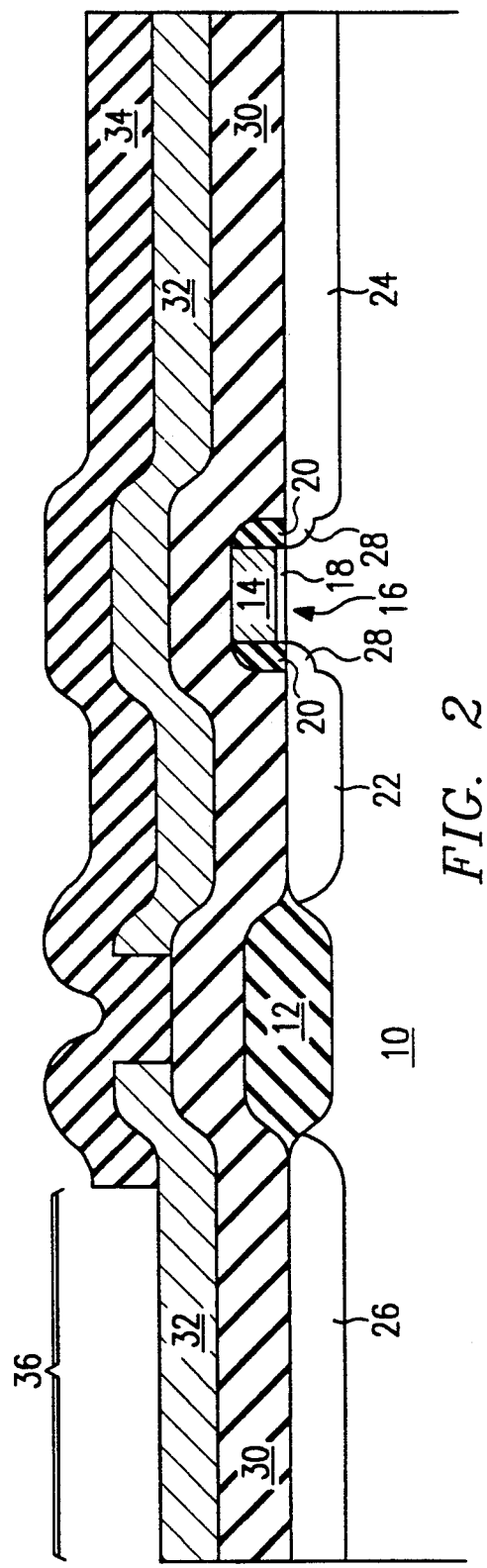

METHOD FOR FABRICATING A POLYCRYSTALLINE SILICON RESISTIVE LOAD ELEMENT IN AN INTEGRATED CIRCUIT

This is a division of application Ser. No. 07/531,022, filed May 31, 1990. Now U.S. Pat. No. 5,069,201.

BACKGROUND OF THE INVENTION

1. Field of the Invention

The present invention relates generally to integrated circuits, and more specifically to a structure, and method for forming same, useful in the fabrication of high resistance regions and low resistance regions in a single polycrystalline silicon layer.

2. Description of the Prior Art

CMOS SRAMs often use a four transistor cell design having resistive load devices. This design is used in order to save chip layout area over the traditional six transistor cell design. Two N-channel transistors are used to form a cross-coupled latch, while two additional N-channel transistors are used to provide access to the cell for reading and writing data. Two load devices are connected between the N-channel transistors in the latch and the power supply.

In the prior art, the resistive load devices are formed after formation of the transistors. After the transistors have been formed, a dielectric layer is deposited and contact openings are formed to the substrate. A second polycrystalline silicon layer is deposited and light doped N-type to achieve a resistivity in the range of $10^6$ to $10^{13}$ ohms/square. This blanket implant determines the load resistor value.

The second polycrystalline silicon layer also serves to provide interconnect between various portions of the integrated circuit. It can be used for the $V_{cc}$ supply connected to the load resistors. It may also be used for local interconnect between various portions of the device.

The interconnect portions of the second polycrystalline silicon layer must have a relatively low resistivity. In order to lower the resistance of the interconnect regions, the locations used for the resistive load devices are masked and a highly doped N-type implant is made. This implant lowers the resistivity of the interconnect regions to, typically, a range of between 100 and 1000 ohms/square. The second polycrystalline layer is typically patterned to define the resistive devices and interconnect signal lines after all of the implants have been made.

It is desirable to use a single polycrystalline silicon layer for both the resistive load devices and interconnect lines. Such an approach is more economical than forming such regions from separate polycrystalline silicon layers, and also results in a relatively smoother chip surface. However, this approach has an important drawback in that the resistivity of the resistive element regions and the interconnect regions are somewhat related. It has heretofore been difficult to form both very high resistance and very low resistance regions in a single polycrystalline silicon layer.

It would be desirable to provide a structure and method for fabricating very high resistance and very low resistance regions in a single polycrystalline silicon layer. It would be further desirable for a technique to form such regions to be compatible with current technology, and add a minimal amount of complexity to device process flows.

SUMMARY OF THE INVENTION

It is therefore an object of the present invention to provide a structure and method for use with integrated circuits which allows high resistance resistive elements and low resistance interconnect to be formed in a single polycrystalline silicon layer.

It is a further object of the present invention to provide such a structure and method which is compatible with presently available process technology.

It is another object of the present invention to provide such a structure and method which adds a minimal amount of complexity to the fabrication of integrated circuits.

Therefore, according to the present invention, a method for forming integrated circuit structures includes the formation of high-value resistive elements and low resistance interconnect in a single polycrystalline layer. In one embodiment, interconnect regions of the polycrystalline silicon layer are masked, and resistive element regions are partially oxidized to reduce the thickness of the polycrystalline layer in such regions. Resistivity of the interconnect regions may then be reduced by implanting a high level of impurities in them, or by forming a refractory metal silicide layer over the interconnect regions. The oxide formed over the resistive elements during the oxidation thereof protects them from either of the following process steps, so that no masking is required. In an alternative embodiment, silicidation of the interconnect regions of the polycrystalline silicon layer may be performed without the prior local oxidations of the resistive element regions.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1-4 illustrate a method for fabricating an integrated circuit according to a first embodiment of the present invention;

DESCRIPTION OF THE PREFERRED EMBODIMENTS

Figure 3:
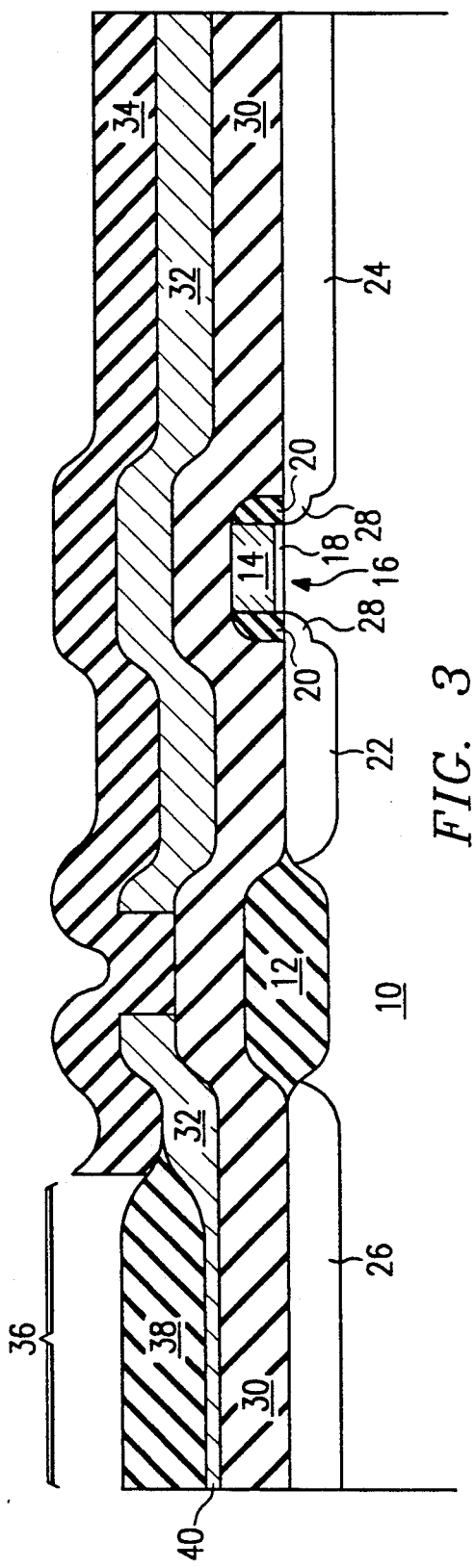

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 1, an integrated circuit is formed in a silicon substrate 10. A field oxide region 12 separates selected active regions of the circuit. A polycrystalline silicon gate 14 is separated from a channel region 16 within the substrate 10 by a thin gate oxide 18. Side wall oxide spacers 20 are formed on either side of the gate 14 as known in the art. The polycrystalline silicon gate 14 may have its conductivity enhanced by the addition of a refractory metal silicide layer (not shown) as known in the art.

Highly doped active regions 22, 24 form source/drain regions for the field effect transistor defined by gate 14. Active region 26 is a source/drain region for a transistor which is not shown in FIG. 1. Lightly doped drain (LDD) regions 28 are formed adjacent to the channel region 16.

All of the structures described so far are formed using conventional process steps. The process steps of the present invention will now be described. These process steps are suitable for use in the formation of resistive load devices for a CMOS SRAM cell. As will be appreciated by those skilled in the art, the process steps described below may be utilized with any type of integrated circuit device.

Dielectric layer 30 is formed over the surface of the integrated circuit. This layer 30 may be an LPCVD/APCVD/LTO oxide layer. If desired, such an oxide layer may be deposited followed by an LPCVD nitride layer. At this stage of the processing, an anneal step is typically performed to repair source-/drain implant damage and to activate the source/drain regions. Contact openings to the substrate and to gate interconnect leads are then formed in the insulating layer 30. For the sake of simplicity, none of the contact openings cut through the insulating layer 30 are shown in the cross-section of FIG. 1.

A layer of polycrystalline silicon 32 is then deposited over the integrated circuit. This layer 32 is preferably deposited using LPCVD techniques and is deposited as an intrinsic layer to obtained preferred grain structure. A blanket N− implant is then made to set the resistivity of the entire polycrystalline silicon layer 32 to the desired resistivity for the load devices.

Referring to FIG. 2, polycrystalline silicon layer 32 is patterned to define the resistive and interconnect load elements. Patterning of the polycrystalline silicon layer 32 is performed using a photo resist mask and etch as known in the art.

A layer of silicon nitride 34 is then deposited over the integrated circuit, preferably using LPCVD. Nitride layer 34 is then patterned to expose the polycrystalline silicon layer 32 in those regions in which the resistive load elements are to be formed. Region 36 is one of such regions.

Referring to FIG. 3, the exposed polycrystalline silicon in layer 32 is oxidized in steam to convert a portion thereof to oxide 38. The remaining, thin portion of the polycrystalline layer 40 forms the high value resistor. The oxidation operation is preferably timed to convert between approximately fifty percent and ninety percent of the polycrystalline silicon layer 32 into oxide 38. The proportion of the polycrystalline silicon layer 32 to be converted to oxide can be varied as desired to suit the requirements of the device. The width of the resistive load element 40 is reduced, although its small height-/width ratio means that most of the oxidation will occur from the top. Its resistivity increases in a ratio proportional to the amount of polycrystalline silicon consumed during the oxidation step. For example, converting ninety percent of the polycrystalline silicon in region 36 into oxide increases the resistance of the resistive load element 40 by a factor of approximately 10. The remaining portions of the polycrystalline silicon layer 32 are protected by the nitride layer 34, and are not oxidized.

Figure 4:
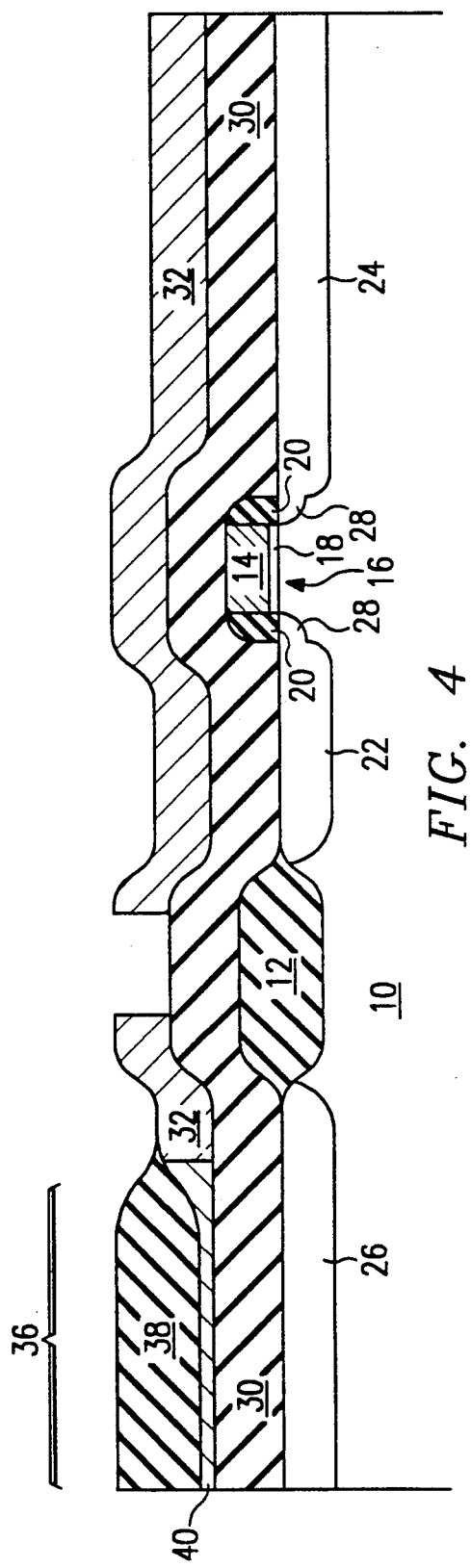

Referring to FIG. 4 the nitride layer 34 is removed and a blanket N+ implant is made to decrease the resistance of the interconnect portions of polycrystalline silicon layer 32. The oxide region 38 prevents this implant from affecting the resistive load element region 40.

Figure 5:
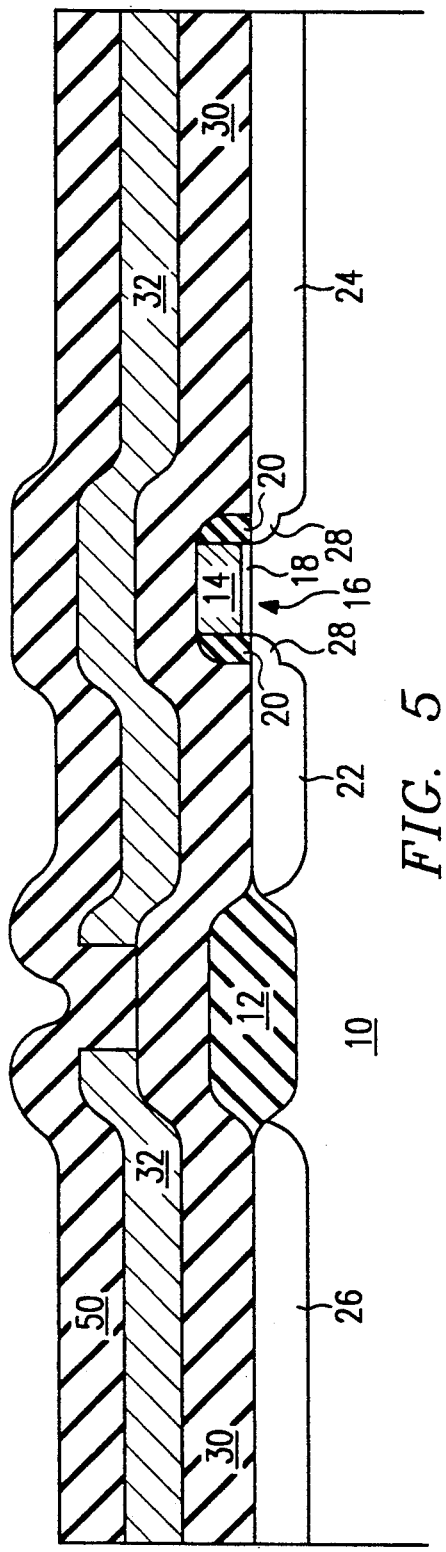
FIGS. 5-7 illustrate a method for fabricating an integrated circuit according to a second preferred embodiment of the present invention.

Referring to FIG. 5, an alternative method for forming resistive load devices and interconnect within a single polycrystalline silicon layer is shown. Processing is substantially the same as described in FIG. 2, with a nitride layer 50 being deposited over the surface of the integrated circuit after the polycrystalline silicon layer 32 has been patterned to define interconnect and resistive load devices.

Figure 6:
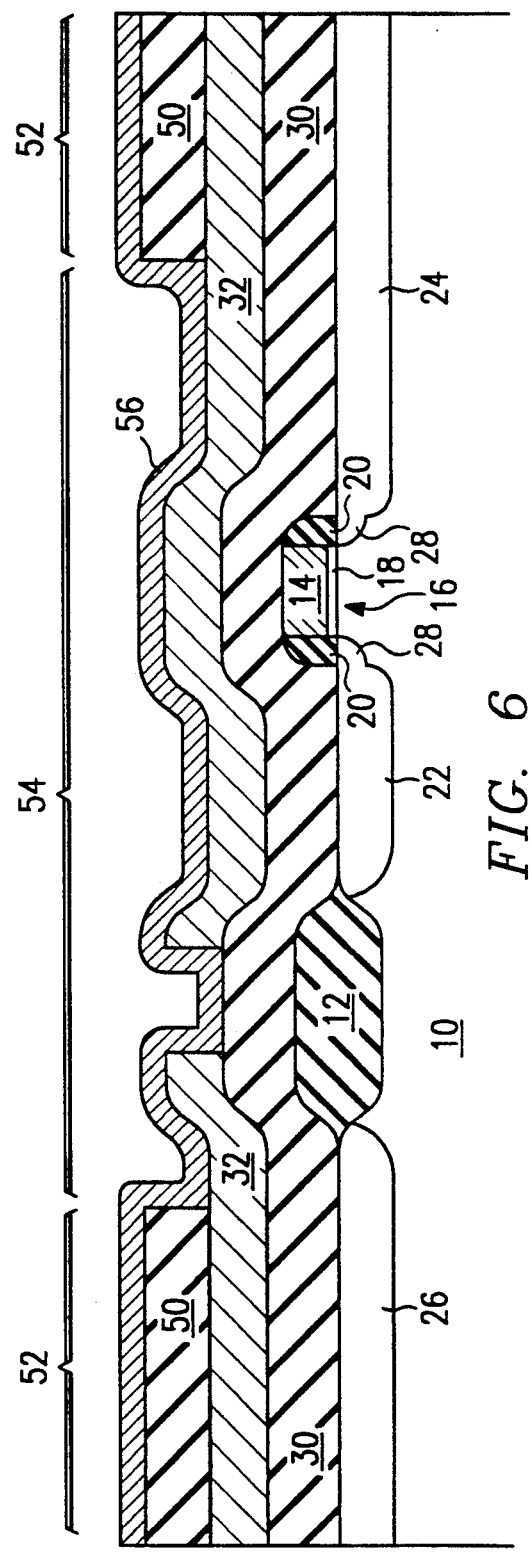

Referring to FIG. 6, the nitride layer 50 is patterned to define resistive load element regions 52 and interconnect regions 54. The nitride 50 is removed from the interconnect regions 54, and left in place over the resistive element regions 52. A layer of refractory metal 56, such as titanium, tantalum, or niobium, is deposited over the surface of the device.

A thermal step is then performed to convert the refractory metal to a silicide as known in the art. This step may be performed using a rapid thermal anneal or furnace annealing, in an inert ambient. Silicidation of the polycrystalline silicon reduces interconnect resistances to the range of approximately 10 ohms/square. The nitride layer 50 prevents silicidation of the resistive load element regions 52.

Figure 7:
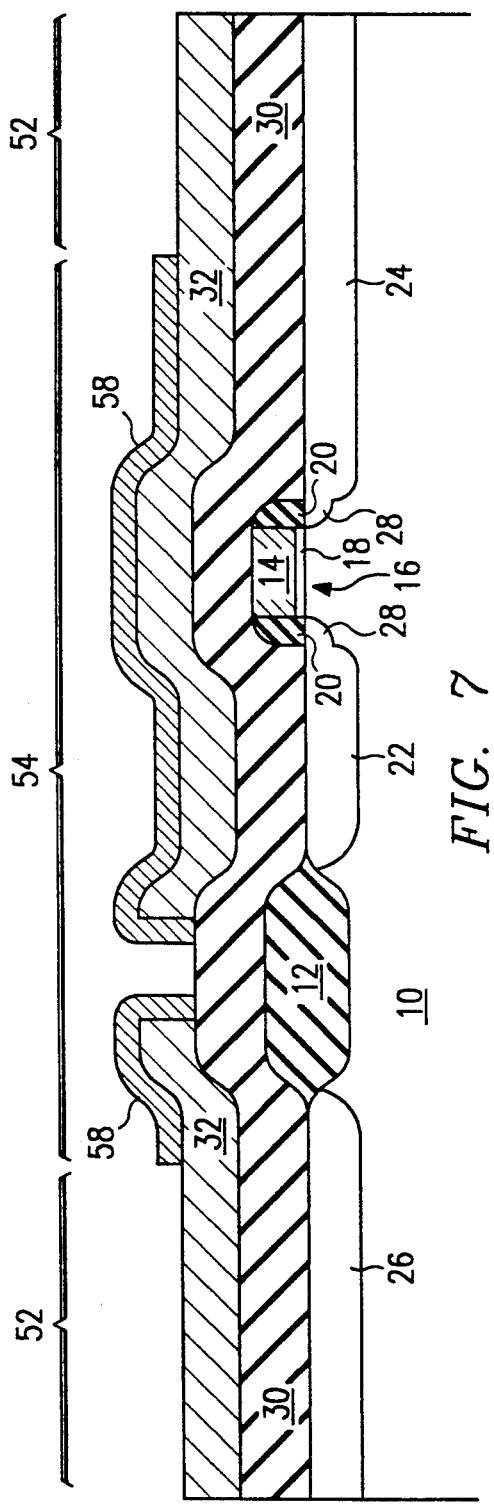

Referring to FIG. 7, the unreacted refractory metal is removed, followed by removal of the remaining nitride layer. The silicide regions 58 provide for a low resistance interconnect, while the resistive load elements have the higher resistance defined by the previous N− implant.

Figure 8:
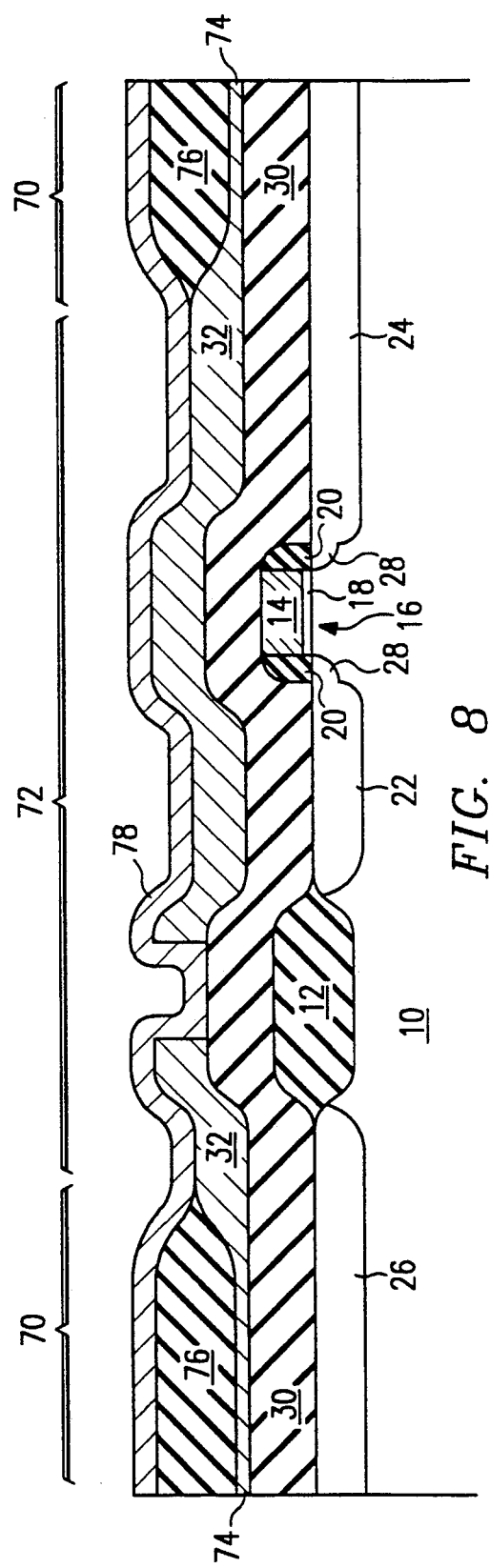
FIGS. 8 and 9 illustrate a method for fabricating an integrated circuit according to a third preferred embodiment of the present invention.

FIG. 8 illustrates another alternative technique which combines the approaches already described. As in FIG. 2, a nitride mask (not shown) is used to define resistive load element regions 70 and interconnect regions 72. Resistive load element regions 70 are exposed through the nitride mask, and oxidized as described above to form thin polycrystalline silicon resistive load elements 74 underlying oxide regions 76. The nitride mask is then removed, and a layer of refractory metal 78 deposited over the device.

Figure 9:
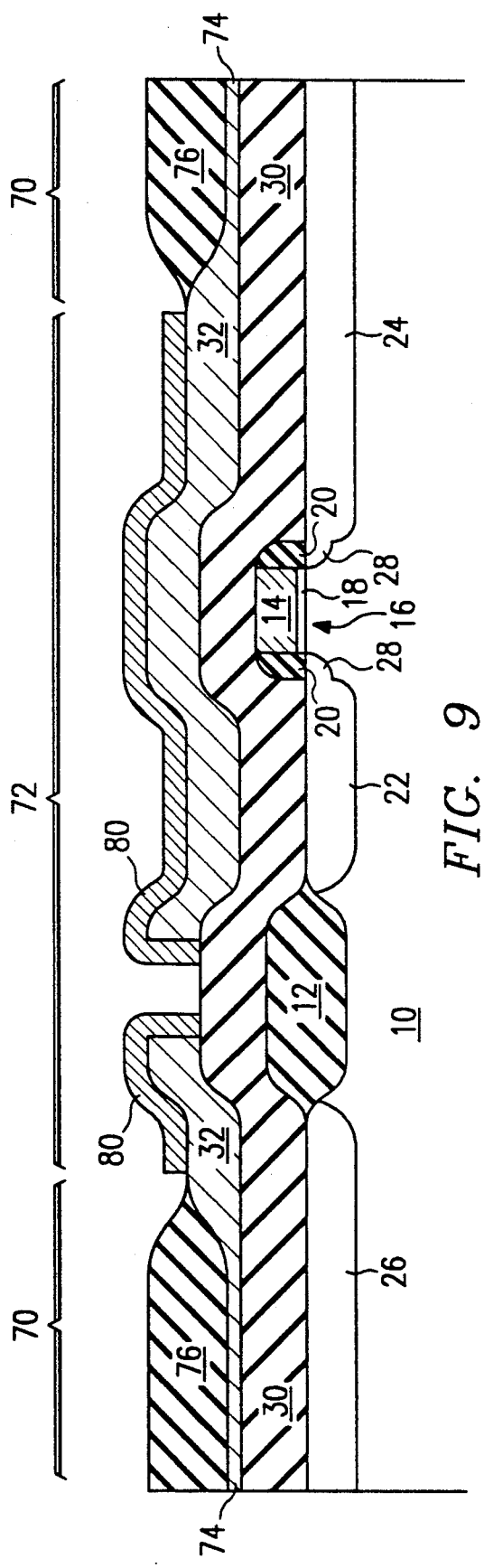

Referring to FIG. 9 a thermal step is performed as described above to form silicide layers 80 within the interconnect region 72. Reoxidized polycrystalline silicon regions 76 prevent silicidation of the resistive elements 74 during this thermal step. After silicidation, the unreacted refractory metal is removed.

With each of the embodiments described above, standard processing techniques continue after those which are described to complete fabrication of the device.

As will be appreciated by those skilled in the art, the techniques illustrated above are suitable for use in fabricating resistive load elements for CMOS SRAM circuits. It will be further appreciated that the described techniques can be used in any integrated circuit in which it is desired to produce a high resistance element and low resistance elements within the same polycrystalline silicon layer. The described techniques utilize no extraordinary processing steps, and are completely compatible with current processing technology.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a polycrystalline silicon resistive load element in an integrated circuit, comprising the steps of:

forming a layer of polycrystalline silicon over an insulating layer;

patterning the polycrystalline silicon to define a resistive load element having a top and side surfaces;

forming a masking layer over the polycrystalline silicon layer;

patterning the masking layer to expose the top and side surfaces of polycrystalline silicon in locations wherein the resistive load elements are to be formed; and oxidizing the exposed polycrystalline silicon to convert a portion of the top and the side surfaces of the exposed polycrystalline silicon to oxide.

2. The method of claim 1, wherein said oxidizing step comprises oxidizing the integrated circuit in an atmosphere containing steam.

3. The method of claim 1, wherein a depth of the polycrystalline silicon layer amounting to 50% to 90% of the total depth is converted to oxide.

4. The method of claim 1, wherein the masking layer comprises silicon nitride.

* * * * *